(12) United States Patent
Akiyama et al.

(10) Patent No.: US 11,245,377 B2
(45) Date of Patent: Feb. 8, 2022

(54) COMPOSITE SUBSTRATE AND METHOD OF MANUFACTURING COMPOSITE SUBSTRATE

(71) Applicant: Shin-Etsu Chemical Co., Ltd., Tokyo (JP)

(72) Inventors: Shoji Akiyama, Gunma (JP); Masayuki Tanno, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 691 days.

(21) Appl. No.: 16/073,063

(22) PCT Filed: Jan. 6, 2017

(86) PCT No.: PCT/JP2017/000272
§ 371 (c)(1),
(2) Date: Jul. 26, 2018

(87) PCT Pub. No.: WO2017/134980
PCT Pub. Date: Aug. 10, 2017

(65) Prior Publication Data
US 2019/0036505 A1    Jan. 31, 2019

(30) Foreign Application Priority Data

Feb. 2, 2016   (JP) .............................. JP2016-017916
Mar. 8, 2016   (JP) .............................. JP2016-043992

(51) Int. Cl.
  *H03H 3/08*     (2006.01)
  *H03H 9/02*     (2006.01)
  (Continued)

(52) U.S. Cl.
  CPC .......... *H03H 3/08* (2013.01); *H01L 41/1873* (2013.01); *H01L 41/312* (2013.01); *H03H 3/02* (2013.01);
  (Continued)

(58) Field of Classification Search
  CPC . H01L 41/1876; H01L 41/1873; H01L 21/86; H03H 9/25; H03H 9/02574; H03H 9/02559
  See application file for complete search history.

(56) References Cited

U.S. PATENT DOCUMENTS

2004/0255842 A1   12/2004   Kajigaya et al.
2005/0194864 A1    9/2005   Miura et al.
(Continued)

FOREIGN PATENT DOCUMENTS

EP    2993686 A1    3/2016
JP    2004328712 A  11/2004
(Continued)

OTHER PUBLICATIONS

Machine Language Translation of WO Publication WO 2014/077213, May 2014. (Year: 2020).*

(Continued)

*Primary Examiner* — Bryan P Gordon
(74) *Attorney, Agent, or Firm* — Hauptman Ham, LLP

(57) ABSTRACT

A composite substrate includes a single crystal support substrate containing first element as a main component; an oxide single crystal layer provided on the single crystal support substrate and containing a second element (excluding oxygen) as a main component; and an amorphous layer provided in between the single crystal support substrate and the oxide single crystal layer and containing a first element, a second element, and Ar, the amorphous layer having a first amorphous region in which proportion of the first element is higher than proportion of the second element, and a second amorphous region in which the proportion of the second element is higher than the proportion of the first element, concentration of Ar contained in the first amorphous region (Continued)

being higher than concentration of Ar contained in the second amorphous region and being 3 atom % or more.

6 Claims, 6 Drawing Sheets

(51) Int. Cl.
*H01L 41/187* (2006.01)
*H01L 41/312* (2013.01)
*H03H 3/02* (2006.01)
*H03H 9/25* (2006.01)
*H01L 21/86* (2006.01)
*H01L 41/337* (2013.01)

(52) U.S. Cl.
CPC .......... *H03H 9/02574* (2013.01); *H03H 9/25* (2013.01); *H01L 21/86* (2013.01); *H01L 41/337* (2013.01); *H03H 9/02559* (2013.01); *H03H 9/02834* (2013.01)

(56) References Cited

U.S. PATENT DOCUMENTS

| | | | |
|---|---|---|---|
| 2009/0230346 A1* | 9/2009 | Hamada | H01L 41/1876 252/62.9 PZ |
| 2010/0088868 A1 | 4/2010 | Kando et al. | |
| 2014/0210316 A1* | 7/2014 | Hori | H01L 41/0838 310/348 |
| 2014/0210317 A1* | 7/2014 | Tai | H01L 41/053 310/348 |
| 2016/0071761 A1 | 3/2016 | Tobisaka et al. | |
| 2019/0036505 A1* | 1/2019 | Akiyama | H03H 9/02574 |
| 2019/0326878 A1* | 10/2019 | Kakita | H01L 41/047 |
| 2019/0356297 A1* | 11/2019 | Komiyama | H03H 9/02866 |
| 2019/0372552 A1* | 12/2019 | Gaudin | H03H 9/02566 |

FOREIGN PATENT DOCUMENTS

| | | |
|---|---|---|
| JP | 2005-252550 A | 9/2005 |
| JP | 2005-328499 A | 11/2005 |
| JP | 2005317822 A | 11/2005 |
| JP | 2005-347295 A | 12/2005 |
| JP | 2012-213244 A | 11/2012 |
| WO | 2005/112259 A1 | 11/2005 |
| WO | 2014/077213 A1 | 5/2014 |
| WO | 2014077212 A1 | 5/2014 |
| WO | 2014/178356 A1 | 11/2014 |

OTHER PUBLICATIONS

"Temperature compensation technology for SAW-Duplexer used in RF front end of smartphone", Dempa Shimbun High Technology, Nov. 8, 2012, Online, Searched Mar. 20, 2015, URL: http://www.yuden.co.jp/jp/product/tech/column/20121108.html, Japan, 10pp.
Hideki Takagi et al., "Room-temperature bonding of lithium niobate and silicon wafers by argon-beam surface activation", Applied Physics Letters, Apr. 19, 1999, pp. 2387-2389, vol. 74, No. 16, 3pp.
International Search Report in PCT/JP2017/000272, dated Mar. 28, 2017, 4pp.
Written Opinion of the ISA in PCT/JP2017/000272, dated Mar. 28, 2017, 12pp.
Office Action in JP Application No. 2019-118168, dated Apr. 21, 2020, 14pp.
Extended European Search Report in EP Application No. 17747144.8, dated Aug. 19, 2019, 10pp.

* cited by examiner

FIG. 4A
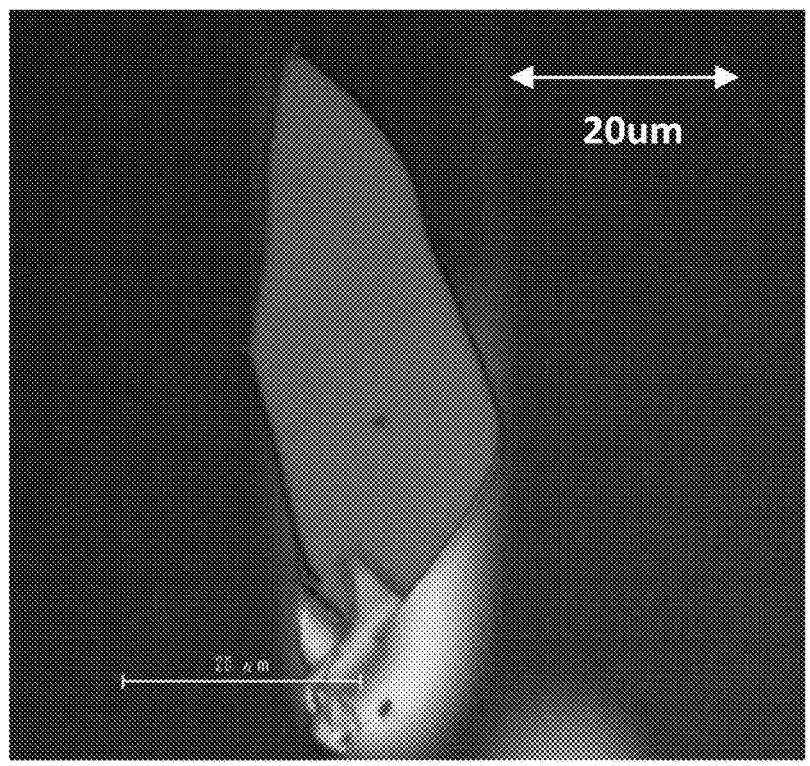
FIG. 4B
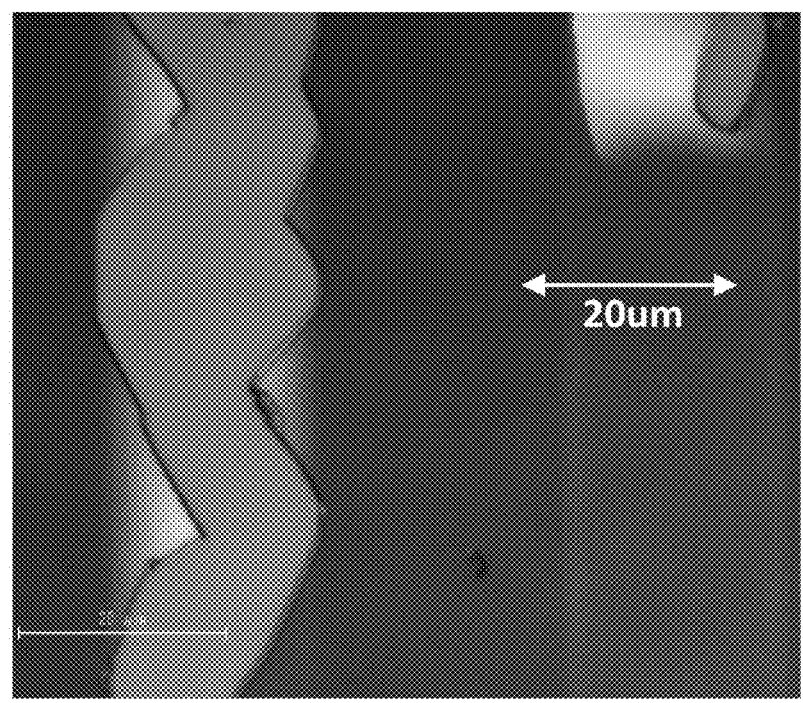
FIG. 4

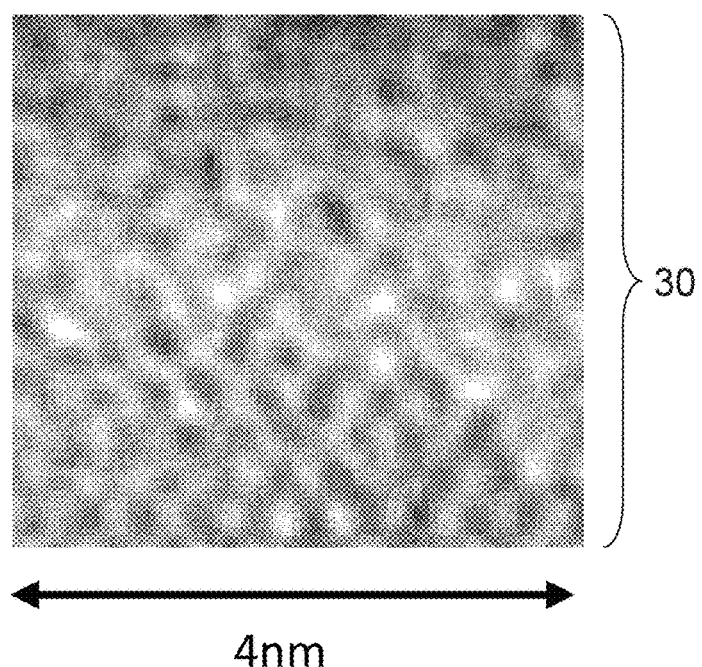
FIG. 6A
4nm
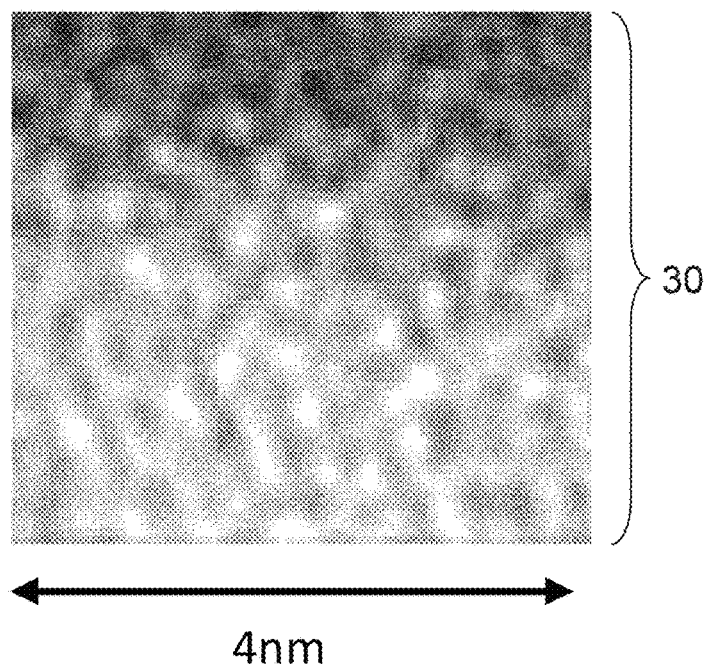
FIG. 6B
4nm
FIG. 6

COMPOSITE SUBSTRATE AND METHOD OF MANUFACTURING COMPOSITE SUBSTRATE

RELATED APPLICATIONS

The present application is a National Phase of International Application No. PCT/JP2017/000272, filed Jan. 6, 2017 and claims priority of Japanese Patent Application No. 2016-017916, filed Feb. 2, 2016 and Japanese Patent Application No. 2016-043992, filed on Mar. 8, 2016.

TECHNICAL FIELD

The present invention relates to a composite substrate used for a surface acoustic wave (SAW) device or the like and a method of manufacturing the composite substrate.

BACKGROUND ART

In recent years, in a market of mobile communication typified by smartphones, communication traffic volume is rapidly increasing. In order to support this, it is important to increase the number of bands required, and inevitably, to miniaturize various parts and improve the performance of the various parts.

Lithium tantalate (sometimes abbreviated as LT) or lithium niobate (sometimes abbreviated as LN) that are general piezoelectric materials are widely used as materials of surface acoustic wave (SAW) devices. Although these materials have a large electromechanical coupling coefficient and widening of a bandwidth can be performed with the materials, temperature stability is low, and there is a problem that a frequency that can be handled shifts due to the temperature change. This is because lithium tantalate and lithium niobate have a very high thermal expansion coefficient.

In order to alleviate this problem, a method of bonding a material having a smaller thermal expansion coefficient, specifically sapphire, to lithium tantalate or lithium niobate, thinning a wafer of lithium tantalate or lithium niobate to several μm to several tens of μm by grinding or the like, and thereby, suppressing thermal expansion and improving temperature characteristics, has been proposed (for example, see Non Patent Document 1). Bonding with silicon having a further smaller thermal expansion coefficient has also been proposed (for example, see Patent Document 1).

However, it is known that, when heat treatment is applied in order to increase bonding strength after these materials are bonded, warping, peeling, cracking or the like occurs in the substrates due to a difference in expansion coefficients of both substrates. In order to avoid this problem, room temperature bonding has been proposed in which high bonding strength can be acquired immediately after bonding (for example, see Non Patent Document 2). In this method, substrates to be bonded are irradiated with an argon (Ar) beam under high vacuum, surfaces are activated, and the substrates are bonded as they are.

PRIOR ART REFERENCES

Patent Document

Patent Document 1: JP 2005-347295 A

Non Patent Document

Non Patent Document 1: Dempa Shimbun High Technology, Nov. 8, 2012 "SAW-Duplexer Temperature Compensation Technology Used for RF Front End of Smartphone"

Non Patent Document 2: Applied Physics Letters Vol. 74, Number 16, pp. 2387-2389, 19 Apr. 1999

SUMMARY OF THE INVENTION

Problems to be Solved by the Invention

However, although a bonding method at room temperature as described above has a feature that high bonding strength can be acquired at room temperature, sufficient bonding strength often cannot be acquired even with a composite substrate thus acquired. Therefore, there is a possibility that peeling may occur in the course of device fabrication or the like. Further, from the viewpoint of long-term reliability, more complete bonding property is required.

An object of the present invention is to provide a composite substrate and a method of manufacturing the composite substrate with which sufficient bonding strength can be acquired in bonding of a piezoelectric material layer and a support substrate.

Means for Solving the Problems

In order to solve the problems described above, the present invention is characterized by being a composite substrate including; a single crystal support substrate containing a first element as a main component; an oxide single crystal layer provided on the single crystal support substrate and containing a second element (excluding oxygen) as a main component; and an amorphous layer provided in between the single crystal support substrate and the oxide single crystal layer and containing the first element, the second element, and Ar, the amorphous layer having a first amorphous region in which proportion of the first element is higher than proportion of the second element, and a second amorphous region in which the proportion of the second element is higher than the proportion of the first element, concentration of the Ar contained in the first amorphous region being higher than concentration of the Ar contained in the second amorphous region and being 3 atom % or more.

According to such a configuration, bonding strength between the single crystal support substrate and the oxide single crystal layer can be enhanced by segregation and concentration of the Ar contained in the amorphous layer.

In the composite substrate of the present invention, the concentration of the Ar contained in the second amorphous region may be less than 3 atom %. Thereby, the bonding strength between the single crystal support substrate and the oxide single crystal layer can be further improved.

In the composite substrate of the present invention, the single crystal support substrate may include one selected from a group consisting of a silicon single crystal substrate and a sapphire single crystal substrate. The oxide single crystal layer may contain one selected from a group consisting of lithium tantalate and lithium niobate. The thickness of the oxide single crystal layer may be 50 μm or less. This makes it possible to support thin-film piezoelectric devices. The oxide single crystal layer is preferably single polarized. This makes it possible to suitably use the composite substrate as a surface acoustic wave element.

The method of manufacturing a composite substrate of the present invention includes a step of activating a surface of a single crystal support substrate containing a first element as a main component and a surface of an oxide single crystal substrate containing a second element (excluding oxygen) as a main component, using Ar; a step of bonding the surface of the single crystal support substrate activated by the Ar with the surface of the oxide single crystal substrate activated by the Ar to form an amorphous layer containing the first element, the second element, and the Ar in between the single crystal support substrate and the oxide single crystal substrate; a step of forming an oxide single crystal layer by reducing a thickness of the oxide single crystal substrate; and a heat treatment step, the amorphous layer having a first amorphous region in which proportion of the first element is higher than proportion of the second element, and a second amorphous region in which the proportion of the second element is higher than the proportion of the first element, the heat treatment step including setting concentration of the Ar contained in the first amorphous region to be higher than concentration of the Ar contained in the second amorphous region and to be 3 atom % or more.

According to such a configuration, a composite substrate in which bonding strength between the single crystal support substrate and the oxide single crystal layer can be enhanced by segregation and concentration of the Ar contained in the amorphous layer, can be manufactured.

In the method of manufacturing the composite substrate of the present invention, the heat treatment step may include setting the concentration of the Ar contained in the second amorphous region to be less than 3 atom %. Thereby, the composite substrate in which the bonding strength between the single crystal support substrate and the oxide single crystal layer can be further improved, can be manufactured.

In the method of manufacturing the composite substrate of the present invention, the heat treatment step may include heating the amorphous layer to 150° C. or higher. Thereby, the Ar contained in the amorphous layer can be made to have segregation and concentration with which the bonding strength between the single crystal support substrate and the oxide single crystal layer can be increased.

In the method of manufacturing the composite substrate of the present invention, the single crystal support substrate may include one selected from a group consisting of a silicon single crystal substrate and a sapphire single crystal substrate. The oxide single crystal layer may contain one selected from a group consisting of lithium tantalate and lithium niobate. The thickness of the oxide single crystal layer may be 50 μm or less. This makes it possible to support thin-film piezoelectric devices.

In the method of manufacturing the composite substrate of the present invention, the method may further include a step of applying ion implantation to a predetermined depth of the oxide single crystal layer before bonding of the single crystal support substrate and the oxide single crystal layer, and the step of reducing the thickness of the oxide single crystal layer may include peeling a part of the oxide single crystal substrate at the ion implanted position. As a result, a composite substrate including a thin oxide single crystal layer can be manufactured by peeling a part of the oxide single crystal layer at the ion implanted position.

In the method of manufacturing the composite substrate of the present invention, the oxide single crystal substrate is preferably single polarized. The method may further include a step of single polarizing the oxide single crystal layer of the composite substrate. By single polarizing the oxide single crystal layer by using these methods, the composite substrate manufactured by the method of manufacturing the composite substrate of the present invention can be suitably used as a surface acoustic wave element.

BRIEF DESCRIPTION OF THE DRAWINGS

FIG. 4A and FIG. 4B are optical micrographs of the composite substrate on which minute peeling has occurred by a peel test.

FIG. 6A and FIG. 6B are cross-sectional TEM photographs illustrating a state of an amorphous layer before and after the heat treatment.

DESCRIPTION OF EMBODIMENTS

Figure 1:
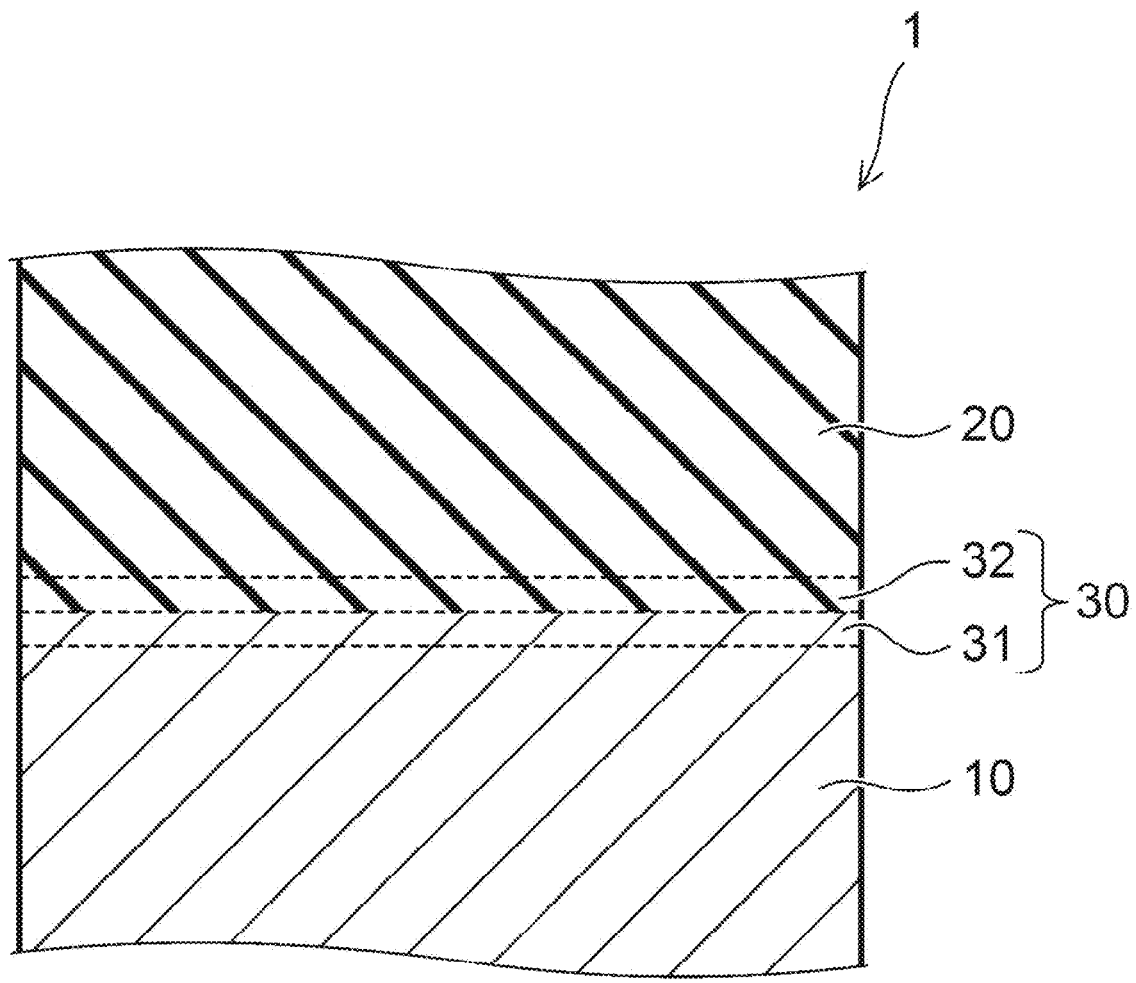
FIG. 1 is a schematic cross-sectional view illustrating a composite substrate according to an embodiment.

An Embodiment of the present invention will be described below with reference to the drawings. In the description below, the same members are denoted by the same reference numerals, and explanations of members once described are omitted as appropriate.

[Configuration of Composite Substrate]

Figure 2:
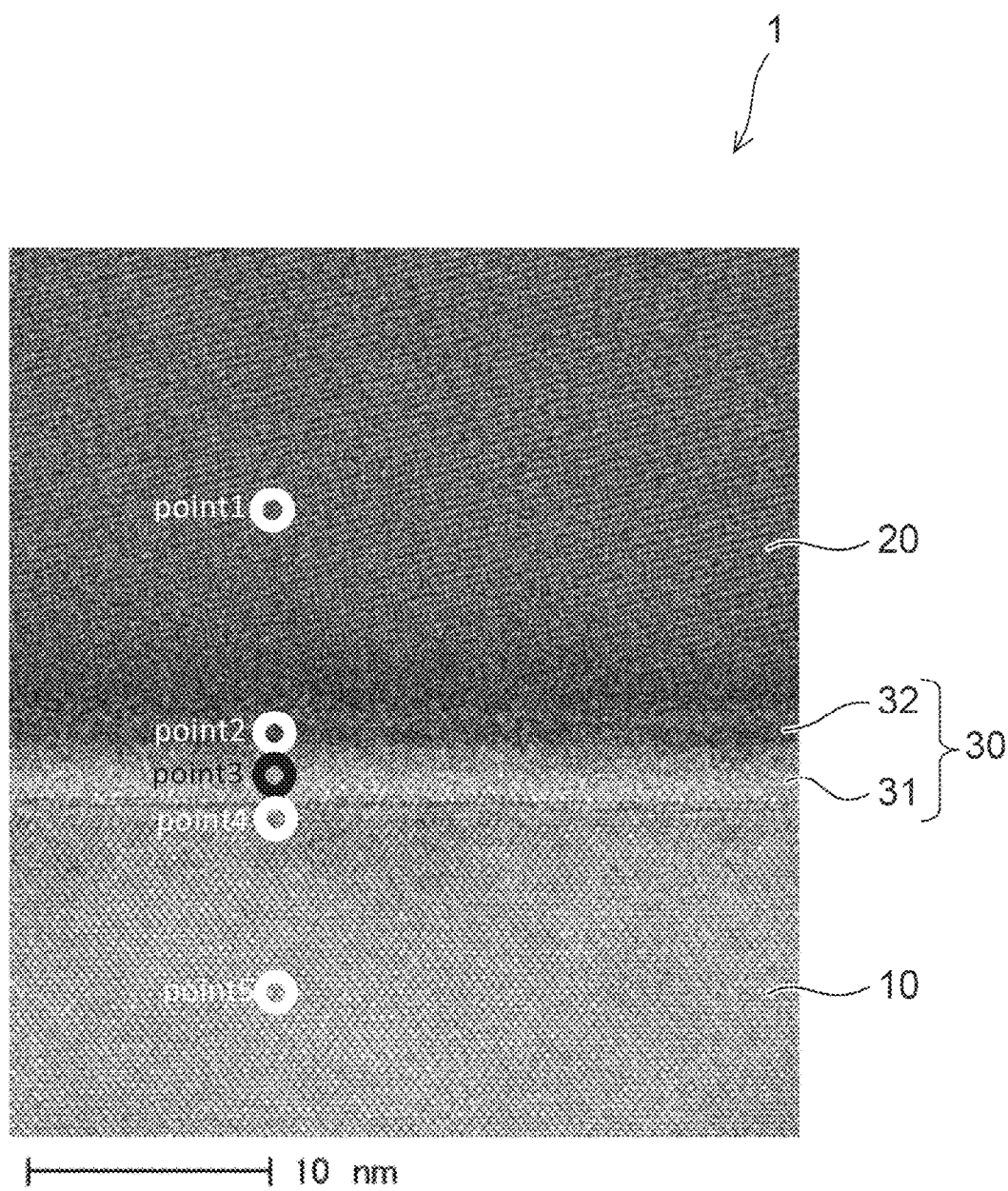
FIG. 2 is a cross-sectional photograph of the composite substrate according to the embodiment.

FIG. 1 is a schematic cross-sectional view illustrating a composite substrate according to the present embodiment. FIG. 2 is a cross-sectional photograph of the composite substrate according to the present embodiment. The cross-sectional photograph illustrated in FIG. 2 is a TEM image.

A composite substrate 1 according to the present embodiment includes: a single crystal support substrate 10 containing a first element as a main component; an oxide single crystal layer 20 containing a second element (excluding oxygen) as a main component; and, for example, an amorphous layer 30 provided in between the single crystal support substrate 10 and the oxide single crystal layer 20.

The single crystal support substrate 10 is a substrate for supporting the oxide single crystal layer 20 that is a thin film in the composite substrate 1. A thermal expansion coefficient of the single crystal support substrate 10 is smaller than a thermal expansion coefficient of the oxide single crystal layer 20. As the single crystal support substrate 10, one selected from a group consisting of a silicon single crystal substrate and a sapphire single crystal substrate is used. In the present embodiment, a case where a silicon single crystal substrate is used as the single crystal support substrate 10 is taken as an example. In the case of using a silicon single crystal substrate, the first element is silicon (Si).

The oxide single crystal layer 20 is provided on the single crystal support substrate 10. The oxide single crystal layer 20 is a thin-film piezoelectric material film supported by the single crystal support substrate 10. The oxide single crystal layer 20 has a thickness of several μm to several tens of μm due to polishing, partial peeling, or the like. The oxide single crystal layer 20 is preferably single polarized.

The oxide single crystal layer 20 includes one selected from a group consisting of lithium tantalate and lithium niobate. In the present embodiment, the case where lithium tantalate is used as the oxide single crystal layer 20 is taken as an example. When lithium tantalate is used, the second element is tantalum (Ta).

The amorphous layer 30 contains a first element, a second element, and Ar. The amorphous layer 30 is formed in the vicinity of a bonding interface at the time of bonding the single crystal support substrate 10 and the oxide single crystal layer 20. When a silicon single crystal substrate is used as the single crystal support substrate 10 and lithium tantalate is used as the oxide single crystal layer 20, an amorphous region of Si and Ta is formed in the vicinity of the bonding interface, and the Ar is included in the amorphous region. Note that the Ar is the Ar with which each bonding surface of the single crystal support substrate 10 and the oxide single crystal layer 20 is activated in the method of manufacturing the composite substrate described later.

The amorphous layer 30 provided in the vicinity of the bonding interface has a first amorphous region 31 in which the proportion of the first element (for example, Si) is higher than the proportion of the second element (for example, Ta), and a second amorphous region 32 in which the proportion of the second element (for example, Ta) is higher than the proportion of the first element (for example, Si). The boundary between the first amorphous region 31 and the second amorphous region 32 serves as the bonding interface.

At point 1 to point 5 illustrated in the cross-sectional TEM image of FIG. 2, it was found that point 2, point 3 and point 4 are made amorphous, from a result of microscopic electron beam diffraction conducted simultaneously with the acquisition of the cross-sectional TEM image. Therefore, the region of the layer including the point 2, the point 3, and the point 4 is the amorphous layer 30.

Table 1 shows the result of composition analysis of each point of the point 1 to the point 5 illustrated in the cross-sectional TEM image of FIG. 2, by energy dispersive X-ray analysis (EDX). Note that target elements are four of oxygen (O), Si, Ar, and Ta. The composition analysis shown in Table 1 is a state before the heat treatment (before segregating Ar) after room temperature bonding of the single crystal support substrate 10 and the oxide single crystal layer 20.

TABLE 1

|  | Si | Ta | O | Ar |
|---|---|---|---|---|
| point1 | 0 | 43.3 | 55.8 | 0.9 |
| point2 | 2.1 | 44.7 | 51.4 | 1.8 |
| point3 | 94.5 | 0.2 | 3.5 | 1.8 |
| point4 | 97.9 | 0 | 0.6 | 1.5 |
| point5 | 98.5 | 0 | 0.8 | 0.7 | atomic %

As shown in Table 1, the point 1 does not contain Si, and the point 5 does not contain Ta. At the point 2, the proportion of the Ta as the second element is higher than the proportion of the Si as the first element. On the other hand, at the point 3, the proportion of the Si as the first element is higher than the proportion of the Ta as the second element. In other words, it can be seen that the concentration of the Si abruptly changes between the point 2 and the point 3, and this is considered to be the bonding interface.

The region of the point 3 that is the amorphous layer 30 is the first amorphous region 31 in which the proportion of the first element (Si) is higher than the proportion of the second element (Ta), and the region of the point 2 is the second amorphous region 32 in which the proportion of the second element (Ta) is higher than the proportion of the first element (Si).

It is considered that the reason of formation of the amorphous layer 30 by bonding the single crystal support substrate 10 and the oxide single crystal layer 20 is that the Ar used for activating the surface remains in the crystal and is taken in as it is. It can be seen that, as shown in Table 1, immediately after the single crystal support substrate 10 and the oxide single crystal layer 20 are bonded, Ar is widely and thinly distributed from the point 1 to the point 5.

On the other hand, the Ar is segregated by heat treatment after the bonding. The present inventors have found that the bonding strength between the single crystal support substrate 10 and the oxide single crystal layer 20 can be enhanced by the segregation and concentration of the Ar contained in the amorphous layer 30. The segregation and concentration of the Ar that can increase the bonding strength will be described later.

[Method of Manufacturing Composite Substrate]

Figure 3:
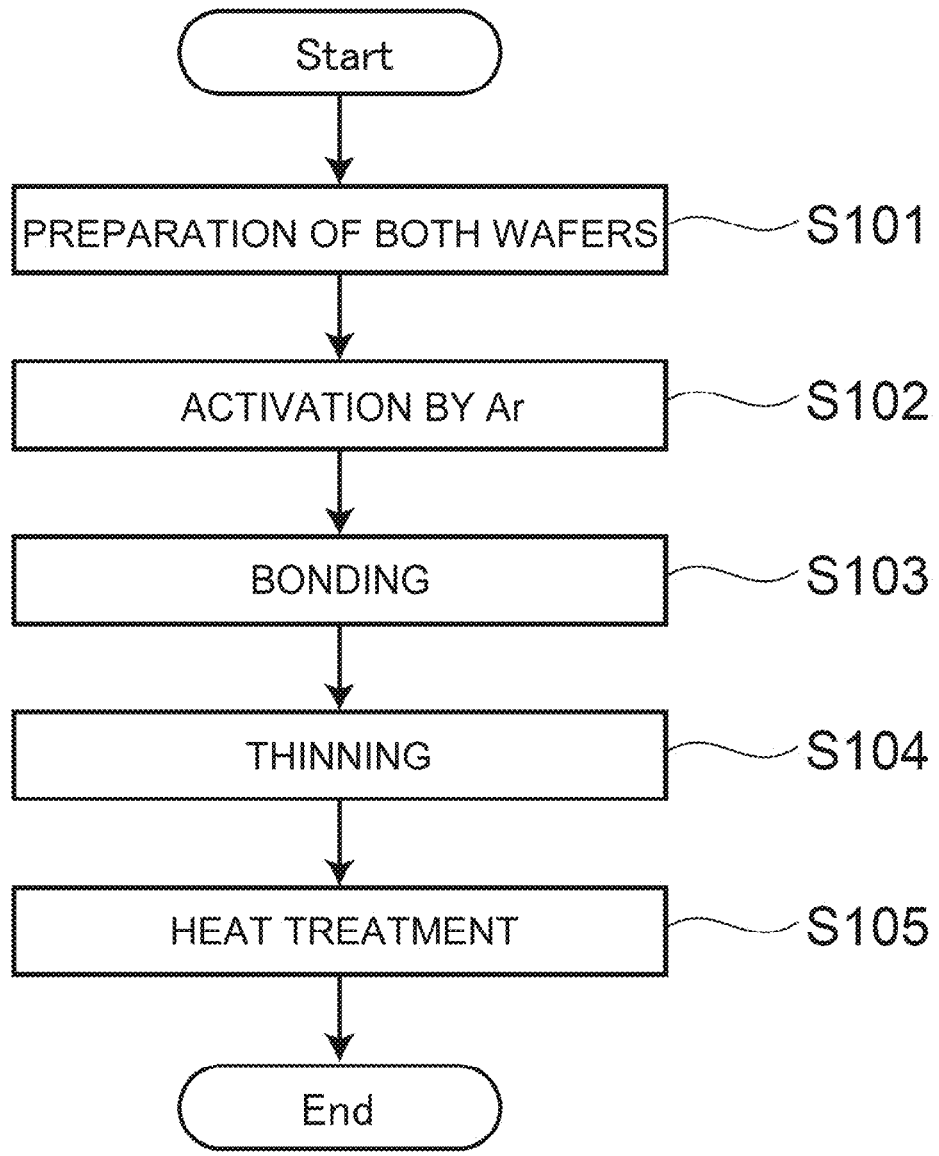
FIG. 3 is a flowchart illustrating a method of manufacturing the composite substrate according to the embodiment.

FIG. 3 is a flowchart illustrating the method of manufacturing the composite substrate according to the present embodiment.

First, as shown in step S101, the single crystal support substrate 10 and the oxide single crystal substrate are prepared. As the single crystal support substrate 10, one selected from a group consisting of a silicon single crystal substrate and a sapphire single crystal substrate is used. In the present embodiment, a case where a silicon single crystal substrate (for example, a silicon single crystal wafer) is used as the single crystal support substrate is taken as an example. The oxide single crystal substrate includes one selected from a group consisting of lithium tantalate and lithium niobate. The oxide single crystal layer used here is preferably single polarized. In the present embodiment, a case of using a lithium tantalate substrate (for example, a lithium tantalate wafer) is taken as an example.

It is desirable that the surface of each of the silicon single crystal wafer and the lithium tantalate wafer be planarized. For example, surface roughness of both wafers is set to 1.0 nm or less in RMS.

Next, as shown in step S102, activation by Ar is performed. That is, the surfaces of the silicon single crystal wafer and the lithium tantalate wafer that are to be bonded, are activated by Ar. For example, the surfaces of both wafers are activated in an Ar atmosphere under high vacuum.

Next, as shown in step S103, bonding is performed. The surfaces of the silicon single crystal wafer and the lithium tantalate wafer that have been activated by Ar in the previous step S102 are bonded to each other. Since the surfaces are activated, bonding at room temperature can be performed. By this bonding, the amorphous layer 30 (the first amorphous region 31 and the second amorphous region 32) is formed in the vicinity of the bonding surface between the silicon single crystal wafer and the lithium tantalate wafer.

Next, as shown in step S104, a process for forming the oxide single crystal layer 20 is performed. That is, the lithium tantalate wafer is ground and polished to a desired thickness (for example, 50 μm or less) to form the oxide single crystal layer (lithium tantalate layer) 20 made to be a thin film.

Next, heat treatment is performed as shown in step S105. Segregation of the Ar is performed by this heat treatment. Specifically, the concentration of the Ar contained in the first amorphous region 31 is higher than the concentration of the Ar contained in the second amorphous region 32, and is set to 3 atom % or more. By such processing, the composite substrate 1 is completed.

As a result of conducting various experiments on such a composite substrate 1 and the method of manufacturing the same, the inventors have newly found that strong bonding strength can be acquired by segregating the Ar serving as an impurity in the amorphous layer 30 on the single crystal support substrate 10 side by heat treatment.

In this case, it is found that an optimum condition for obtaining stronger bonding is that the Ar concentration is 3 atom % or more on the silicon single crystal wafer side in the vicinity of the bonding interface, and less than 3 atom % in other places.

One of the reasons why strong bonding can be acquired by segregating the Ar in this way is as follows. That is, elements such as the Ar that do not have a bond may cause film peeling at the interface when being localized at the interface. It is considered that segregation of the Ar in the Si side that is relatively easy to contain impurities can increase the bonding strength of the interface. Although it is difficult to define the heat treatment temperature, time, and the like at this time, as an example, it is possible to perform at a relatively high temperature (for example, about 250° C. or higher and 550° C. or lower) for a short time, or at a relatively low temperature (for example, about 150° C. or higher and 250° C. or lower) for a very long time (for example, about 24 hours).

This method can be similarly applied not only to thinning by grinding/polishing but also to strengthening of the bonding force of the thin film acquired by the ion implantation peeling method. Because this phenomenon is a phenomenon of the bonding interface, since ions to be implanted for peeling are separated from the bonding interface by about several hundred nm to several μm, the influence of the ions on the phenomenon at the bonding interface is small.

Here, the ion implantation peeling method is a method of performing ion implantation to a predetermined depth of the oxide single crystal substrate (lithium tantalate wafer) before bonding both wafers, and after bonding, peeling part of the lithium tantalate wafer at the ion implanted position to form the oxide single crystal layer (lithium tantalate layer) 20.

Specifically, a wafer (donor wafer) acquired by preliminarily implanting ions into a wafer of lithium tantalate or lithium niobate, and a material having a low thermal expansion coefficient (low thermal expansion coefficient as compared to lithium tantalate and lithium niobate) such as quartz (glass), Si, or sapphire as a supporting wafer, are prepared. The surface roughness of both wafers is set to 1.0 nm or less in RMS, and surface activation treatment is applied to one or both wafers. After bonding both wafers, part of the donor wafer is peeled off at the ion implanted position to form a thin film of lithium tantalate or lithium niobate. Thereby, the composite substrate 1 in which the thin film of lithium tantalate or lithium niobate is supported on the supporting wafer is completed. At this time, as a peeling method, a mechanical peeling method such as the SiGen method can be cited as a simple method, but the peeling method is not particularly limited.

With such a manufacturing method, the composite substrate 1 in which bonding strength between the single crystal support substrate 10 and the oxide single crystal layer 20 is enhanced by segregation and concentration of the Ar contained in the amorphous layer 30, can be acquired. By using the oxide single crystal substrate that is single polarized as the oxide single crystal substrate in the manufacturing method described above, the composite substrate manufactured by the manufacturing method can be suitably used as a surface acoustic wave element. Even when the manufacturing method further includes a step of single polarizing the oxide single crystal substrate, similarly, the composite substrate manufactured by the manufacturing method can be suitably used as the surface acoustic wave element.

First Example

The conditions of the first example are shown below. A lithium tantalate wafer (hereinafter also referred to as "LT wafer") having a diameter of 100 mm and a thickness of 0.35 mm and a Si wafer serving as a supporting wafer are prepared. The surface roughness of both wafers is 1.0 nm or less in RMS. These wafers are irradiated with an Ar beam under high vacuum so that surface activation is performed, and then bonded. After bonding, the LT wafer is thinned to 5 μm, and heat treatment is performed according to each condition. A peel test is performed on samples prepared under the respective heat treatment conditions. The peel test is a method of pasting a tape of polyimide to the wafers so as to be closely adhered, and then peeling off the tape. If the bonding strength of the bonding is not sufficient, when the peel test is performed, minute peeling as illustrated in the optical micrographs of FIG. 4A and FIG. 4B occurs. Table 2 shows the results of the peel test and the results of EDX inspection using the Ar in each layer of the bonded wafer as a target element.

TABLE 2

| | | Without heat treatment | 120° C. 6 h | 150° C. 6 h | 150° C. 24 h | 200° C. 6 h | 250° C. 6 h | 300° C. 6 h | 350° C. 6 h | 400° C. 6 h | 450° C. 6 h | 500° C. 6 h |
|---|---|---|---|---|---|---|---|---|---|---|---|---|
| EDX test result | point1 | 0.9 | 0.6 | 0.5 | 0.4 | 0.3 | 0.4 | 0.3 | 0.2 | 0.3 | 0.2 | 0.3 |
| | point2 | 1.8 | 2 | 2.1 | 2.9 | 2.8 | 2.6 | 2.4 | 2.1 | 1.7 | 1.5 | 1.4 |
| | point3 | 1.8 | 2.3 | 2.8 | 3 | 3.3 | 3.7 | 3.9 | 5.1 | 7.2 | 8.9 | 12.5 |
| | point4 | 1.5 | 1.4 | 1.4 | 2.8 | 2.7 | 2.4 | 1.9 | 1.5 | 0.9 | 0.7 | 0.5 |
| | point5 | 0.7 | 0.5 | 0.5 | 0.4 | 0.4 | 0.2 | 0 | 0 | 0 | 0 | 0 |
| Peel test result | | Peeling | Peeling | Partially peeling | No peeling | No peeling | No peeling | No peeling | No peeling | No peeling | No peeling | No peeling | atomic %

Figure 5:
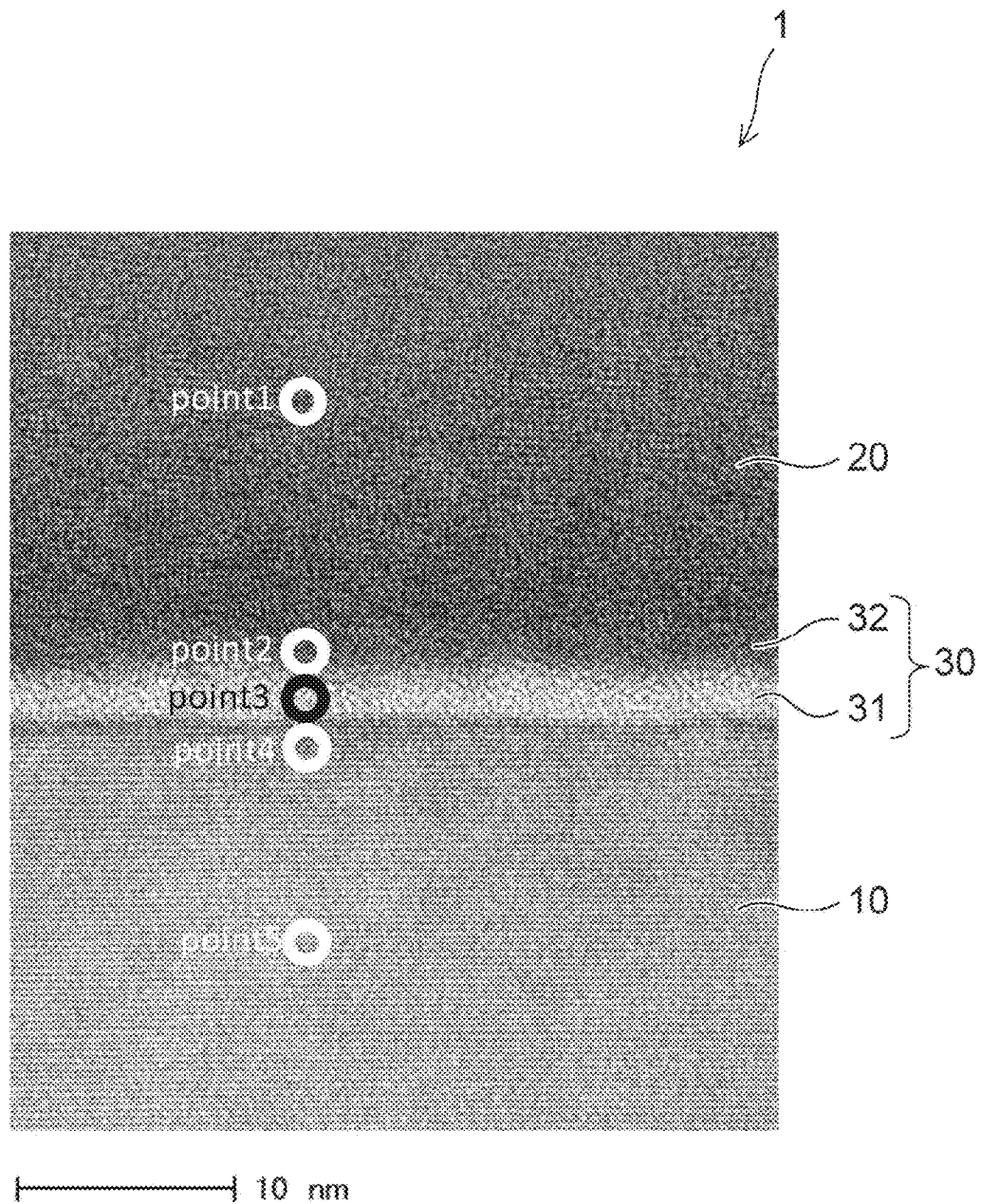
FIG. 5 is a cross-sectional TEM photograph of the composite substrate after heat treatment.

FIG. 5 is a cross-sectional TEM photograph of the composite substrate 1 after heat treatment at 500° C. for 6 hours as a condition of the heat treatment in the first example. FIG. 6A and FIG. 6B are cross-sectional TEM photographs illustrating a state of the amorphous layer before and after the heat treatment. It can be seen that the concentration of the Ar in the first amorphous region 31 of the amorphous layer 30 that is the point 3 becomes very high, by the heat treatment at 500° C. for 6 hours.

From the results shown in Table 1, it can be seen that a condition for having high bonding force is that the Ar concentration is 3 atom % or more in the Si side (point 3) in the vicinity of the bonding interface, and less than 3 atom % in the other portions.

Second Example

In the second example, similar inspection is performed using the lithium niobate wafer (hereinafter also referred to as "LN wafer") instead of the LT wafer in the first example. The test result of the second example is the same as in the first example.

Third Example

In a third example, similar inspection is performed using a sapphire wafer instead of the Si wafer in the first example. The test result of the third example is also the same as in the first example.

Fourth Example

In a fourth example, the ion implantation peeling method is applied as the thinning of the LT wafer in the first example. That is, hydrogen ions are implanted into a predetermined position of the LT wafer in advance, and after the LT wafer is bonded with the Si wafer, mechanical peeling is performed. Thereafter, heat treatment is performed according to each condition, and similar inspection similar to that in the first example is performed. The test result of the fourth example is also the same as in the first example.

Fifth Example

In a fifth example, similar inspection is performed using an LN wafer instead of the LT wafer in the fourth example. The test result of the fifth example is also the same as in the first example.

Sixth Example

In a sixth example, as similar to the fourth example, the ion implantation peeling method is applied as the thinning of the LT wafer. That is, hydrogen ions are implanted into a predetermined position of the LT wafer in advance, and after the LT wafer is bonded with the sapphire wafer as the support substrate, mechanical peeling was performed.

The thickness of the thinned LT of the bonded substrate composed of the thinned LT wafer and the sapphire wafer thus acquired was 1 μm.

Next, when the thin LT wafer and the sapphire wafer thus acquired were subjected to the heat treatment at 500° C. for 6 hours, the EDX inspection result of the bonding interface between the LT wafer and the sapphire wafer was the same as the case of the treatment at 500° C. for 6 hours shown in Table 2 of Example 1, and when the peel test was carried out, a result without peeling was acquired.

Next, in order to single polarize the thinned LT wafer, treatment was performed for heating the bonded substrate composed of the thinned LT wafer and the sapphire wafer to 700° C. that is equal to or more than the Curie point temperature of the LT, applying an electric field of approximately 4000V/m in a +Z axis direction in between 700° C. to 500° C. during the process of further cooling the bonded substrate wafer, and then lowering the temperature to room temperature. The EDX inspection result of the bonding interface of the bonded substrate composed of the thinned LT wafer and the sapphire wafer after being applied with the heating and the electric field application treatment was the same as the case of the treatment at 500° C. for 6 hours shown in Table 2 of Example 1, and when the peel test was carried out, a result without peeling was acquired.

Next, when a voltage waveform acquired by inducing the bonded substrate wafer by using a piezo d33 meter (model type ZJ-3BN) manufactured by Chinese Academy of Sciences Voice Music Laboratory, and applying vertical vibration of a thickness direction to a main surface and a rear surface of the bonded substrate wafer, was observed, a waveform showing a piezoelectric response was acquired at all locations of the wafer, and the d33 value was uniformly 5 pC/N in the surface.

It was confirmed that all the bonded substrates composed of the thinned LT and the sapphire wafer of the sixth example has piezoelectric properties in the entire substrate surface by being single polarized, and therefore can be used as the surface acoustic wave element.

As described above, with the composite substrate 1 and the method of manufacturing the composite substrate 1 according to the present embodiment, sufficient bonding strength can be acquired in bonding of the piezoelectric material layer and the support substrate.

Although the present embodiment has been described above, the present invention is not limited to these examples. For example, the one performed with adding, deleting, and design changing of the components with respect to each of the embodiments described above as appropriate by a person skilled in the art, and the one in which the features of each of the embodiments are combined as appropriate are included in the scope of the present invention as long as including the gist of the present invention.

The invention claimed is:

1. A composite substrate comprising:
   a single crystal support substrate containing a first element as a main component,
   an oxide single crystal layer provided on the single crystal support substrate and containing a second element (excluding oxygen) as a main component; and
   an amorphous layer provided in between the single crystal support substrate and the oxide single crystal layer and containing the first element, the second element and Ar,
   the amorphous layer having
   a first amorphous region in which proportion of the first element is higher than proportion of the second element, and
   a second amorphous region in which the proportion of the second element is higher than the proportion of the first element,
   concentration of the Ar contained in the first amorphous region being higher than concentration of Ar contained in the second amorphous region and being 3 atom % or more.

2. The composite substrate according to claim 1, wherein the concentration of the Ar contained in the second amorphous region is less than 3 atom %.

3. The composite substrate according to claim 1, wherein the single crystal support substrate includes one selected from a group consisting of a silicon single crystal substrate and a sapphire single crystal substrate.

4. The composite substrate according to claim 1, wherein the oxide single crystal layer includes one selected from a group consisting of lithium tantalate and lithium niobate.

5. The composite substrate according to claim 1, wherein the oxide single crystal layer has a thickness of 50 μm or less.

6. The composite substrate according to claim 1, wherein the oxide single crystal layer is single polarized.

* * * * *